(12) United States Patent
Esenwein et al.

(10) Patent No.: US 10,021,236 B2
(45) Date of Patent: Jul. 10, 2018

(54) MOBILE FUNCTIONAL APPARATUS

(71) Applicant: Robert Bosch GmbH, Stuttgart (DE)

(72) Inventors: Florian Esenwein, Leinfelden-Echterdingen (DE); Joachim Schadow, Stuttgart (DE); Joern Stock, Wernau (DE); Juergen Wiker, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/380,851

(22) Filed: Dec. 15, 2016

(65) Prior Publication Data

US 2017/0180535 A1    Jun. 22, 2017

(30) Foreign Application Priority Data

Dec. 21, 2015 (DE) .......... 10 2015 226 191

(51) Int. Cl.
| | |
|---|---|
| *H04M 1/00* | (2006.01) |
| *H04M 1/725* | (2006.01) |
| *H02J 50/20* | (2016.01) |
| *H01L 35/28* | (2006.01) |
| *H02J 7/32* | (2006.01) |
| *H02N 2/18* | (2006.01) |
| *H04B 1/3827* | (2015.01) |
| *H01L 41/187* | (2006.01) |
| *H04W 4/80* | (2018.01) |

(52) U.S. Cl.
CPC .......... *H04M 1/7253* (2013.01); *H01L 35/28* (2013.01); *H02J 7/32* (2013.01); *H02J 50/20* (2016.02); *H02N 2/186* (2013.01); *H04B 1/385* (2013.01); *H01L 41/187* (2013.01); *H02N 2/18* (2013.01); *H04B 2001/3855* (2013.01); *H04B 2001/3861* (2013.01); *H04W 4/80* (2018.02)

(58) Field of Classification Search
CPC .......... H04M 1/7253; H02J 50/20; H02J 7/32; H01L 35/28
USPC .............................. 455/572, 41.1, 41.2, 41.3
See application file for complete search history.

(56) References Cited

U.S. PATENT DOCUMENTS

| | | | | |
|---|---|---|---|---|
| 6,239,501 B1 * | 5/2001 | Komarechka | ............ | A43B 3/00 290/1 R |
| 6,788,200 B1 * | 9/2004 | Jamel | ...................... | A43B 3/00 340/539.11 |
| 9,602,641 B2 * | 3/2017 | Kim | ........................ | H04W 4/70 |

(Continued)

FOREIGN PATENT DOCUMENTS

| | | |
|---|---|---|
| DE | 102 25 361 A1 | 1/2004 |
| DE | 103 41 962 A1 | 4/2004 |

(Continued)

*Primary Examiner* — Md Talukder
(74) *Attorney, Agent, or Firm* — Maginot, Moore & Beck LLP (57) ABSTRACT

A mobile functional apparatus is arrangeable on a body part of a user and includes at least one communication unit configured to communicate with at least one external unit and/or at least one sensor unit configured to capture at least one user and/or environment parameter. The mobile functional apparatus further includes at least one energy harvesting unit configured to convert at least one form of energy into electric power for supplying electric power at least to the at least one communication unit and/or to the at least one sensor unit.

14 Claims, 3 Drawing Sheets

(56) References Cited

U.S. PATENT DOCUMENTS

| | | | | |
|---|---|---|---|---|
| 2010/0052992 A1* | 3/2010 | Okamura | ............... | H01Q 1/526 |
| | | | | 343/700 MS |
| 2011/0043338 A1* | 2/2011 | Kato | ................... | G06K 7/0008 |
| | | | | 340/10.1 |
| 2012/0052922 A1* | 3/2012 | Li | ........................ | H04M 19/04 |
| | | | | 455/567 |
| 2012/0316414 A1* | 12/2012 | Greene | ................ | A61B 5/0024 |
| | | | | 600/365 |
| 2013/0099676 A1* | 4/2013 | Hyoung | ................. | H02J 17/00 |
| | | | | 315/155 |
| 2014/0236366 A1* | 8/2014 | Livadaras | .............. | G06Q 10/00 |
| | | | | 700/286 |
| 2014/0273858 A1* | 9/2014 | Panther | ................ | A61B 5/0002 |
| | | | | 455/41.2 |
| 2015/0250418 A1* | 9/2015 | Ashby | .................. | A61B 5/0002 |
| | | | | 600/474 |
| 2015/0257679 A1* | 9/2015 | Ross | ...................... | A61B 5/112 |
| | | | | 702/44 |
| 2016/0199576 A1* | 7/2016 | Savage | ............... | A61B 5/6805 |
| | | | | 604/66 |
| 2016/0261031 A1* | 9/2016 | Dion | .................. | H01Q 1/248 |
| 2016/0277843 A1* | 9/2016 | Babayoff | ............. | H04R 17/005 |
| 2017/0054478 A1* | 2/2017 | Da Silveira | .............. | H04B 1/04 |
| 2017/0120107 A1* | 5/2017 | Wisbey | .................. | G09B 19/00 |
| 2017/0127749 A1* | 5/2017 | Boeck | .................... | A43B 3/001 |
| 2017/0127957 A1* | 5/2017 | Wisbey | .............. | A61B 5/02405 |
| 2017/0150245 A1* | 5/2017 | Armstrong | ........... | H04R 1/1025 |

FOREIGN PATENT DOCUMENTS

| | | |
|---|---|---|
| DE | 103 49 357 A1 | 7/2004 |
| DE | 10 2009 028 547 A1 | 2/2011 |
| DE | 10 2014 212 535 A1 | 12/2015 |

\* cited by examiner

MOBILE FUNCTIONAL APPARATUS

This application claims priority under 35 U.S.C. § 119 to patent application no. DE 10 2015 226 191.3, filed on Dec. 21, 2015 in Germany, the disclosure of which is incorporated herein by reference in its entirety.

BACKGROUND

Mobile functional apparatuses having a storage battery or a battery for supplying electric power have already been proposed.

SUMMARY

The disclosure sets out from a mobile functional apparatus, in particular a mobile functional apparatus that is arrangeable on a body part of a user, having at least one communication unit for communication with at least one external unit and/or having at least one sensor unit for capturing at least one user and/or environment parameter.

It is proposed that the mobile functional apparatus has at least one energy harvesting unit for converting at least one form of energy into electric power for supplying power at least to the at least one communication unit and/or to the at least one sensor unit. The at least one energy harvesting unit is preferably provided in addition to a storage battery or a battery. This allows an advantageously long period of use and hence a preferably high level of user convenience of the mobile functional apparatus to be achieved. It is also conceivable for the at least one energy harvesting unit to be provided as an alternative to a storage battery or a battery and to replace the storage battery or the battery. This allows an advantageously environmentally friendly embodiment of the mobile functional apparatus, in particular in respect of disposal at an end of a period of use or life of the mobile functional apparatus, to be achieved. Further, the embodiment according to the disclosure allows a preferably eco-friendly and sustained supply of power for operating the mobile functional apparatus and, in particular advantageously, autonomous operation, independent of an external supply of power, of the mobile functional apparatus to be achieved.

In this context, a "mobile functional apparatus" is in particular intended to be understood to mean an apparatus that is provided to be carried by a user during operation. In this case, carrying can be effected either directly, such as in particular in a hand of the user, or indirectly, such as in particular via an item of clothing worn by a user and/or via a device that is held by a user. The mobile functional apparatus is preferably formed by a smartband. However, it is also conceivable for the mobile functional apparatus to be in the form of a wearable computer, in particular at least in the form of part of a smartwatch. "Provided" is in particular intended to be understood to mean specifically programmed, designed and/or equipped. An object being provided for a particular function is in particular intended to be understood to mean that the object fulfills and/or performs this particular function in at least one application and/or operating state.

The at least one communication unit preferably has, for communication with the external unit, at least one interface, for an, in particular bidirectional, interchange of data. Various embodiments of the communication unit that appear useful to a person skilled in the art are conceivable, in particular for a wireless communication, however, such as via Bluetooth, in particular according to the 4.0 low energy standard, WLAN, in particular according to the 801.11n standard, Zigbee, NFC, RFID, GSM, LTE or UMTS, for example. However, a wired communication of the at least one communication unit, such as via a USB port, for example, is also, alternatively or additionally, conceivable. The at least one communication unit may preferably also be provided for an access authorization, in particular for at least one room, for a machine authorization, for a cloud connection and/or for another function that appears useful to a person skilled in the art. The external unit may be formed at least in part by a hand-held machine tool, a piece of protective equipment, in particular a piece of personal protective equipment of the user (PSA), a door with access authorization, a garden tool, a smartphone or tablet, an infrastructure element, in particular in residential and/or work spaces. Other embodiments of the external unit that appear useful to a person skilled in the art are also conceivable. The external unit is preferably designed to be operable and usable at least in part independently and separately from the mobile functional apparatus.

The at least one sensor unit is provided for capturing vital data of the user, in particular a body temperature, a pulse, an oxygen saturation, a blood pressure, a respiratory rate, a blood sugar value and/or another body function that appears useful to a person skilled in the art, of a vibration, of an ambient temperature, of a period of use or operation and/or for an identification of gas or pollutants, for example. Alternatively or additionally, other parameters that appear useful to a person skilled in the art are also conceivable. Preferably, the at least one sensor unit is arranged on an extremity, such as in particular an arm, of a user.

The at least one energy harvesting unit is preferably provided for using energy from an environment of the mobile functional apparatus. The at least one energy harvesting unit converts at least some of the at least one form of energy into electric power. The at least one energy harvesting unit is preferably provided for providing at least some of the electric power that is needed for operating the at least one communication unit and/or the at least one sensor unit at least in a use state of the mobile functional apparatus. The at least one form of energy that the at least one energy harvesting unit can convert into electric power is advantageously formed by a body heat of the user or a temperature difference with respect to the environment, by a motion of the user, in particular by a pulse on a wrist of the user and/or by vibration during work, by incident light radiation or insolation, by radio waves from the environment and/or in another way that appears useful to a person skilled in the art.

Further, it is proposed that the at least one energy harvesting unit comprises at least one piezo element for converting kinetic energy generated by a pulse of the user into electric power. This allows an advantageously simple conversion in particular of kinetic energy and/or of percussive impulses into electric power and also a preferably compact embodiment of the at least one energy harvesting unit to be achieved. In this context, a "piezo element" is in particular intended to be understood to mean an element, in particular a solid body, wherein the element, according to the piezo electric effect, has a change of an electrical polarization and, as a result, of an electrical voltage as a reaction to an elastic deformation. The at least one piezo element is preferably formed at least in part from aluminum nitride (AIN) and/or from lead zirconate titanate (PZT).

Furthermore, it is proposed that the mobile functional apparatus comprises at least one attachment unit having at least one attachment element that is provided for arrangement on a body part of a user, wherein the at least one energy harvesting unit comprises at least one piezo element for converting at least one force generated by a deformation of the attachment element into electric power. This allows a preferably effective conversion into electric power by the at least one energy harvesting unit to be achieved. In this context, a "piezo element" is in particular intended to be understood to mean an element, in particular a solid body, wherein the element, according to the piezo electric effect, has a change of an electrical polarization and, as a result, of an electrical voltage as a reaction to an elastic deformation. The at least one piezo element is preferably formed at least in part from aluminum nitride (AlN) and/or from lead zirconate titanate (PZT). The at least one piezo element is preferably provided for using a tensile and compressive force in the attachment element in a use state. The at least one attachment element is preferably, at least in part, in elastic form. The at least one attachment element is advantageously in the form of a wrist band, ankle strap, chest strap and/or in another form that appears useful to a person skilled in the art.

In addition, it is proposed that the at least one energy harvesting unit comprises at least one Peltier element for converting a temperature difference between a skin surface temperature of the user and an ambient temperature into electric power. This allows advantageously simple use of a body heat of the user for generating electric power, and also a preferably compact embodiment of the at least one energy harvesting unit, to be achieved. In this context, a "Peltier element" is in particular intended to be understood to mean an element that is in the form of an electrothermal transducer and provided for generating a flow of current on the basis of the Seebeck effect. The at least one Peltier element is preferably provided for making contact with the surface of the skin of the user.

Further, it is proposed that the at least one energy harvesting unit comprises at least one radio wave element for converting a radiation energy from radio waves into electric power. This allows advantageously eco-friendly and sustained generation of the electric power to be achieved. In this context, "radio waves" are in particular intended to mean a form of electromagnetic radiation. The at least one radio wave element preferably comprises at least one antenna for picking up the radio waves, in particular from an environment of the at least one radio wave element. The at least one radio wave element may preferably be in the form of a passive RFID and/or in another form that appears useful to a person skilled in the art.

Furthermore, it is proposed that the mobile functional apparatus has at least one power transmission unit for transmitting an electric power generated by means of the energy harvesting unit to at least one external unit. This allows advantageously effective utilization of the electric power generated by means of the energy harvesting unit to be achieved in a preferably simple manner. The electric power generated by means of the energy harvesting unit can therefore be used for charging a storage battery of the external unit and/or for operating at least part of the external unit. Advantageously, the external unit comprises at least one corresponding power transmission unit. Preferably, the power transmission unit is provided for bidirectional power transmission. The power transmission unit is preferably provided for wireless power transmission, in particular at least in part by induction.

In addition, it is proposed that the at least one communication unit comprises at least one communication element for communication at a frequency of less than 1000 MHz. This allows an advantageously power-saving embodiment of the communication between the mobile functional apparatus and the external unit to be achieved. The at least one communication element is preferably provided for communication at a frequency of 902 MHz, and in particular preferably at a frequency of 315 MHz. Other frequencies that appear useful to a person skilled in the art are also conceivable.

Further, a system having at least one external unit, in particular having at least one hand-held machine tool, having at least one mobile functional apparatus, in particular having at least the mobile functional apparatus described, and having at least one power transmission unit for transmitting electric power between the at least one external unit and the at least one mobile functional apparatus is proposed. This allows advantageously good and effective use of the available electric power to be achieved. The transmission of the electric power can be effected from the mobile functional apparatus to the external unit, from the external unit to the mobile functional apparatus or bidirectionally between the mobile functional apparatus and the external unit. The external unit can comprise an additional energy harvesting unit for harvesting electric power, which can be transmitted by means of the power transmission unit. The transmitted electric power can be used at least in part for charging a storage battery of the mobile functional apparatus and/or of the external unit and/or for operating at least part of the mobile functional apparatus and/or of the external unit.

Furthermore, a method for operating the system is proposed, wherein at least one method step involves an electric power generated by means of at least one energy harvesting unit being transmitted at least in part from the at least one mobile functional apparatus to the at least one external unit. Alternatively or additionally, there is provision for at least one method step to involve an electric power generated by means of at least one energy harvesting unit being transmitted at least in part from the at least one external unit to the at least one mobile functional apparatus. This allows advantageously good and effective use of the available electric power to be achieved.

The mobile functional apparatus according to the disclosure is not intended to be limited in this case to the application and embodiment described above. In particular, the mobile functional apparatus according to the disclosure can satisfy a functional principle described herein by having a number of individual elements, components and units that differs from that cited herein.

BRIEF DESCRIPTION OF THE DRAWINGS

Further advantages will emerge from the description of the drawings below. The drawing shows multiple exemplary embodiments of the disclosure. The drawing, the description and the claims contain numerous features in combination. A person skilled in the art will expediently also consider the features individually and combine them to form useful further combinations.

In the drawings.

DETAILED DESCRIPTION

Figure 1:
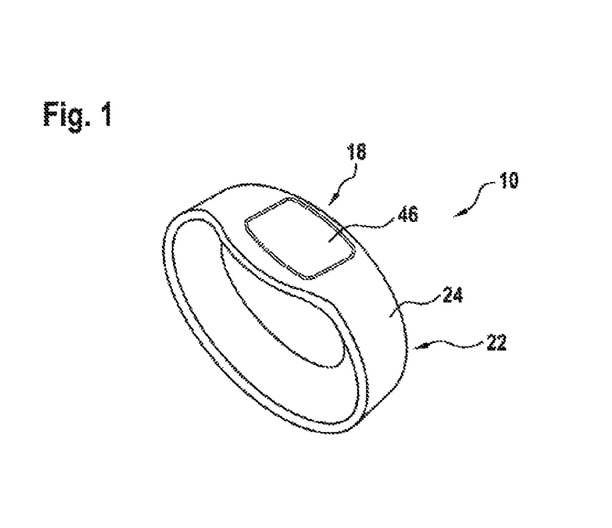
FIG. 1 shows a perspective view of a mobile functional apparatus according to the disclosure.
Figure 2:
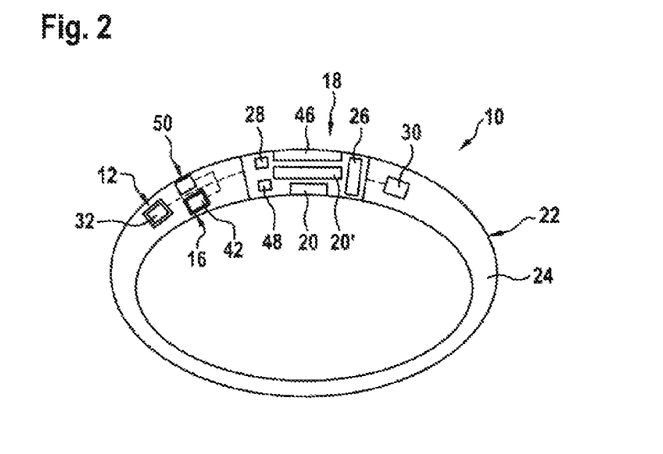
FIG. 2 shows a schematic sectional view of the mobile functional apparatus according to the disclosure.

FIGS. 1 and 2 show a mobile functional apparatus 10. The mobile functional apparatus 10 is designed to be arrangeable on a body part of a user. The mobile functional apparatus 10 is formed by a smartband. The mobile functional apparatus 10 comprises at least one communication unit 12 for communication with at least one external unit 14 and at least one sensor unit 16 for capturing at least one user and/or environment parameter. The mobile functional apparatus 10 comprises precisely one communication unit 12 and precisely one sensor unit 16. However, it is also conceivable for the mobile functional apparatus 10 to have more than one communication unit 12 and more than one sensor unit 16. Further it is also conceivable for the mobile functional apparatus 10 to comprise at least one communication unit 12 or alternatively at least one sensor unit 16.

The sensor unit 16 comprises at least one sensor element 42 for capturing a user and/or environment parameter. The sensor unit 16 comprises a sensor element 42 for capturing a user parameter and a sensor element for capturing an environment parameter. It is also conceivable for the sensor unit 16 to have a different number of sensor elements 42. The user parameter is in the form of a vital parameter of the user, such as in the form of a pulse, heart rate, motion, body temperature and/or in the form of another characteristic variable that appears useful to a person skilled in the art, for example. The environment parameter is in the form of an ambient temperature, humidity, vibrations and/or in the form of another characteristic variable that appears useful to a person skilled in the art, for example. Any combination of sensor elements 42 for capturing the user and/or environment parameters that appears useful to a person skilled in the art is also conceivable.

The communication unit 12 is provided for communication with an external unit 14 formed by a hand-held machine tool 34. The communication unit 12 comprises at least one communication element 32 for communication at a frequency of less than 1000 MHz. The communication unit 12 comprises precisely one communication element 32. However, the communication unit 12 may also have more than one communication element 32. The communication element 32 is provided for communication at a frequency of 902 MHz. Other frequencies that appear useful to a person skilled in the art, such as 315 MHz, for example, are also conceivable. The communication element 32 is provided for sending a piece of information or a command. The communication element 32 is in the form of a transmission element. The external unit 14 comprises a corresponding communication unit 44 having at least one receiving element for receiving the information sent by the communication element 32 of the communication unit 12 of the mobile functional apparatus 10 or the command sent by the communication element 32 of the communication 12 of the mobile functional apparatus 10. The communication unit 44 of the external unit 14 comprises precisely one receiving element. The communication unit 44 of the external unit 14 may also have more than one receiving element, however. The communication unit 12 of the mobile functional apparatus 10 is electrically connected to the sensor unit 16. The communication element 32 of the communication unit 12 is provided for the purpose of taking the at least one user and/or environment parameter captured by the sensor unit 16 as a basis for sending the information or the command.

The mobile functional apparatus 10 additionally comprises at least one attachment unit 22 having at least one attachment element 24 that is provided for arrangement on the body part of the user. The attachment unit 22 has precisely one attachment element 24. However, a different number of attachment elements 24 is also conceivable. The attachment element 24 is in the form of a wrist band. However, other embodiments of the attachment element 24 that appear useful to a person skilled in the art, such as in the form of an ankle strap or in the form of a chest strap, for example, are also conceivable. The attachment element 24 is provided for attachment on a wrist of the user. The attachment element 24 is in elastic form.

The mobile functional apparatus 10 further has at least one energy harvesting unit 18 for converting at least one form of energy into electric power for supplying power at least to the at least one communication unit 12 and/or to the at least one sensor unit 16. The mobile functional apparatus 10 has precisely one energy harvesting unit 18. However, multiple energy harvesting units 18 are also conceivable. The energy harvesting unit 18 is provided for converting at least one form of energy that is present in a use state of the mobile functional apparatus 10 into electric power. The energy harvesting unit 18 comprises at least one piezo element 20 for converting a kinetic energy into electric power. The energy harvesting unit 18 comprises the at least one piezo element 20 for converting a kinetic energy generated by a pulse of the user into electric power. The energy harvesting unit 18 comprises precisely one piezo element 20. However, the energy harvesting unit 18 can also comprise multiple piezo elements 20. The piezo element 20 is formed from aluminum nitride. The piezo element 20 is made up of multiple aluminum nitride crystals. The piezo element 20 is provided for generating electric power by compressing and stretching the piezo element 20. The piezo element 20 is provided for converting a kinetic energy generated by a pulse of the user into electric power. The piezo element 20 is positioned such that it is in contact with the wrist of the user and can transmit a motion of the pulse of the user to the piezo element 20. The motion of the pulse compresses the piezo element 20, as a result of which the motion is converted into electric power. Alternatively or additionally, it is also conceivable for the piezo element 20 to be in the form of a flexible bar that is bent in a use state of the mobile functional apparatus 10, and/or for a mass element to be provided that is accelerated in a use state and strikes the piezo element 20.

The energy harvesting unit 18 additionally has at least one piezo element 20' for converting at least one force generated by a deformation of the attachment element 24 into electric power. The energy harvesting unit 18 comprises precisely one piezo element 20' for converting the force generated by the deformation of the attachment element 24 into electric power. However, the energy harvesting unit 18 may also comprise multiple piezo elements 20' for converting the force generated by the deformation of the attachment element 24 into electric power. The piezo element 20' is formed from aluminum nitride. The piezo element 20' is made up of multiple aluminum nitride crystals. The piezo element 20' is provided for generating electric power by compressing and by stretching the piezo element 20'. The piezo element 20' for converting the force generated by the deformation of the attachment element 24 can also be provided as an alternative to the piezo element 20 for converting the kinetic energy generated by a pulse of the user into electric power. In a use state of the mobile functional apparatus 10, the user moves the hand on which the mobile functional apparatus 10 is arranged, as a result of which the attachment element 24 formed by an elastic band is expanded and released again. This motion of the attachment element 24 also acts on the piezo element 20' and can therefore be converted into electric power.

The energy harvesting unit 18 additionally has at least one Peltier element 26 for converting a temperature difference between a skin surface temperature of the user and an ambient temperature into electric power. The energy harvesting unit 18 has precisely one Peltier element 26. However, the energy harvesting unit 18 may also comprise multiple Peltier elements 26. The Peltier element 26 is provided for converting the temperature difference that exists between the surface of the skin of the user and the environment into electric power.

The energy harvesting unit 18 further comprises at least one radio wave element 28 for converting a radiation energy from radio waves into electric power. The energy harvesting unit 18 has precisely one radio wave element 28. However, the energy harvesting unit 18 may also comprise multiple radio wave elements 28. The radio wave element 28 is provided for picking up radio waves from the environment of the mobile functional apparatus 10 and using the energy of said radio waves and converting them into electric power. The radio wave element 28 is in the form of a passive RFID element. However, other embodiments of the radio wave element 28 that appear useful to a person skilled in the art are also conceivable.

The energy harvesting unit 18 further comprises at least one photovoltaic element 46 for converting light into electric power. The energy harvesting unit 18 has precisely one photovoltaic element 46. However, the energy harvesting unit 18 may also comprise multiple photovoltaic elements 46. The photovoltaic element 46 is formed by a solar panel. However, other embodiments of the photovoltaic element 46 that appear useful to a person skilled in the art are also conceivable.

The energy harvesting unit 18 further comprises at least one generator element 48 for converting a motion of the mobile functional apparatus 10 in a use state into electric power. The energy harvesting unit 18 has precisely one generator element 48. However, the energy harvesting unit 18 may also comprise multiple generator elements 48. The generator element 48 comprises a coil made of an electrically conductive material, a magnet that is mounted so as to be rotatable relative to the coil and a mass element that is eccentrically connected to the magnet and therefore forms an imbalance. The motions that are transmitted to the mobile functional apparatus 10 via the user in a use state cause the mass element that forms the imbalance to accelerate the magnet. The motion of the magnet relative to the coil induces an electrical voltage in the generator element 48. Alternatively or additionally, it is also conceivable for the generator element 48 to comprise a coil and a magnet that is mounted so as to be linearly displaceable relative to the coil, and hence to be in the form of a linear generator. Other embodiments that appear useful to a person skilled in the art are also conceivable.

The energy harvesting unit 18 has the generator element 48, the photovoltaic element 46, the radio wave element 28, the Peltier element 26, the piezo element 20' for converting the force generated by the deformation of the attachment element 24 into electric power and the piezo element 20 for converting the kinetic energy generated by the pulse of the user into electric power, which are provided in combination.

The generator element 48, the photovoltaic element 46, the radio wave element 28, the Peltier element 26 and the piezo elements 20, 20' are electrically connected and connected in parallel. The generator element 48, the photovoltaic element 46, the radio wave element 28, the Peltier element 26 and the piezo elements 20, 20' are provided for generating electric power at least in part simultaneously or at overlapping times. This allows the largest possible amount of electric power to be generated and the energy from the environment of the mobile functional apparatus 10 to be used as well as possible. However, any combinations that appear useful to a person skilled in the art or the use of a single one of the elements for embodying the energy harvesting unit 18 are also conceivable.

Figure 3:
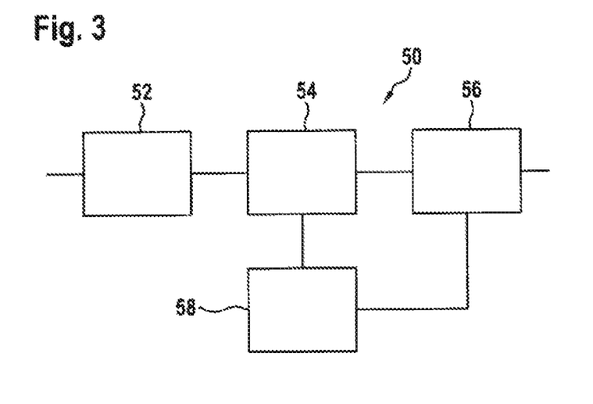
FIG. 3 shows a block diagram of the mobile functional apparatus according to the disclosure.

The mobile functional apparatus 10 additionally has an electronic unit 50 that is provided for processing the electric power that is generated by the energy harvesting unit 18 (FIG. 3). The electronic unit 50 comprises at least one rectifier 52 for rectifying the voltage generated by the energy harvesting unit 18, at least one transformer 54 for transforming the voltage generated by the energy harvesting unit 18 to a higher voltage level, at least one store 56 for buffer-storing the voltage generated by the energy harvesting unit 18 and at least one microcontroller 58 (μC) for managing and controlling the electric power. The electronic unit 50 comprises the rectifier 52, the transformer 54, the store 56 and the microcontroller 58 (μC). The transformer 54 is in the form of a buck or boost converter. The energy harvesting unit 18 is electrically connected to the electronic unit 50.

The mobile functional apparatus 10 further has at least one power transmission unit 30 for transmitting the electric power generated by means of the energy harvesting unit 18 to the external unit 14. The mobile functional apparatus 10 has precisely one power transmission unit 30. Alternatively, the mobile functional apparatus 10 may comprise more than one power transmission unit 30. The external unit 14 comprises a corresponding power transmission unit 36. The power transmission unit 30 of the mobile functional apparatus 10 is provided for wireless transmission of the electric power. The power transmission unit 30 of the mobile functional apparatus 10 is provided for transmission of the electric power for induction. The power transmission unit 30 of the mobile functional apparatus 10 is provided for transmitting electric power to the external unit 14 when the energy harvesting unit 18 generates more electric power than is needed for operating the mobile functional apparatus 10. The electric power transmitted to the external unit 14 is provided for supplying power to a functional unit, for example a sensor and/or communication unit, of the external unit 14. However, it is also conceivable for the transmitted electric power to be provided alternatively or additionally for charging a storage battery pack of the external unit 14. The power transmission unit 30 of the mobile functional apparatus 10 and the power transmission unit 36 of the external unit 14 are provided for bidirectional transmission of the electric power. When the electric power generated by means of the energy harvesting unit 18 of the mobile functional apparatus 10 is not sufficient for operating the mobile functional apparatus 10, electric power is transmitted to the mobile functional apparatus 10 from a power supply for the external unit 14 by means of the power transmission unit 36 of the external unit 14.

Figure 4:
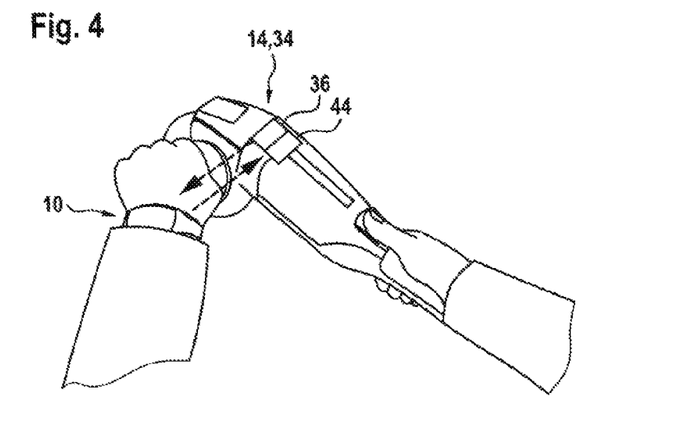
FIG. 4 shows a system having an external unit formed by a hand-held machine tool and having the mobile functional apparatus according to the disclosure.

FIG. 4 shows a system having the mobile functional apparatus 10, which comprises the power transmission unit 30, and having the external unit 14, which comprises the corresponding power transmission unit 36. The power transmission units 30, 36 are provided for transmitting electric power between the external unit 14 and the mobile functional apparatus 10. The external unit 14 is formed by the hand-held machine tool 34. The external unit 14 is formed by an angle grinder. However, other embodiments of the external unit 14 that appear useful to a person skilled in the art, such as, for example, in the form of a door with access authorization, in the form of a garden tool, in the form of a different form of a hand-held machine tool 34, in the form of a smartphone or tablet, in the form of an infrastructure element, in particular in residential and/or workspaces, or in the form of protective equipment of the user, such as a jacket, helmet, trousers, waistcoat, gloves, work boots or protective goggles, are also conceivable.

Figure 5:
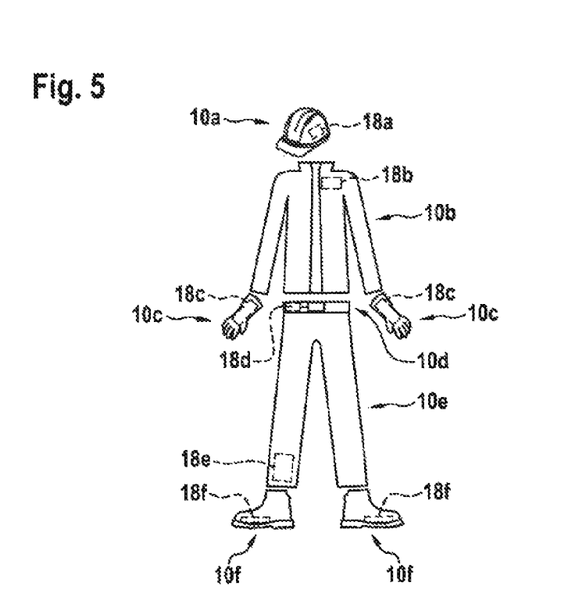
FIG. 5 shows multiple mobile functional apparatuses according to the disclosure in alternative embodiments.

FIG. 5 shows a further exemplary embodiment of the disclosure. The descriptions below and the drawings are limited essentially to the differences between the exemplary embodiments, with fundamental reference also being able to be made to the drawings and/or the description of the other exemplary embodiments, in particular to FIGS. 1 to 4, in relation to components having the same designation, in particular in relation to components having the same reference symbols. To distinguish between the exemplary embodiments, the reference symbols of the exemplary embodiment in FIG. 5 have the suffixed letters a to f.

FIG. 5 shows multiple alternatively embodied mobile functional apparatuses 10a, 10b, 10c, 10d, 10e, 10f in the form of different pieces of work clothing. The different pieces of work clothing, which each form a mobile functional apparatus 10a, 10b, 10c, 10d, 10e, 10f, together form personal protective equipment for a user. The pieces of work clothing are formed by a jacket, trousers, gloves, safety shoes, a belt and a helmet. Other embodiments that appear useful to a person skilled in the art, such as a protective waistcoat, hat, head cover or chest harness, for example, are also conceivable. The mobile functional apparatuses 10a, 10b, 10c, 10d, 10e, 10f each have at least one energy harvesting unit 18a, 18b, 18c, 18d, 18e, 18f for converting at least one form of energy into electric power for supplying power to at least one communication unit, not shown in the present case, and/or at least one sensor unit, not shown in the present case. The jacket, the trousers, the gloves, the safety shoes, the belt and the helmet each have an integrated energy harvesting unit 18a, 18b, 18c, 18d, 18e, 18f. The energy harvesting units 18a, 18b, 18c, 18d, 18e, 18f correspond to the energy harvesting unit 18 already described. The communication units, not shown in the present case, of the mobile functional apparatuses 10a, 10b, 10c, 10d, 10e, 10f formed by the various pieces of work clothing are provided for communication among one another and/or for communication with at least one hand-held machine tool.

Figure 6:
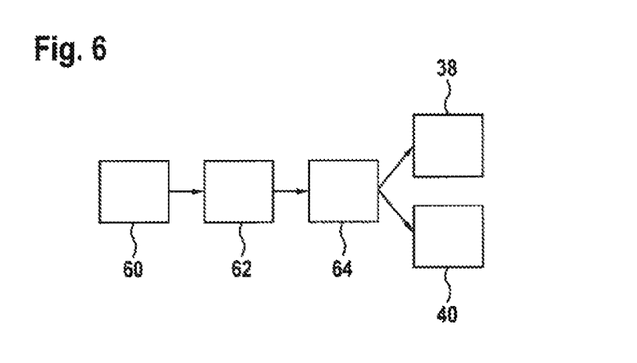
FIG. 6 shows a flowchart for a method for operating the system.

FIG. 6 shows a flowchart for a method for operating the system. For the sake of simplicity, the method is described on the basis of the mobile functional apparatus from FIGS. 1 to 4. The method described is likewise applicable to the alternatively embodied mobile functional apparatuses from FIG. 5, however. The method has a method step 60 in which at least one form of energy from the environment of the mobile functional apparatus 10 is converted into electric power by means of the energy harvesting unit 18. The energy harvesting unit 18 converts the at least one form of energy into electric power in method step 60 in the manner already described. The method has a further method step 62 in which the electric power is processed by means of the electronic unit 50. In method step 62, the electric power generated by means of the energy harvesting unit 18 is rectified and transformed. The method has a further method step 64 in which the electric power is used. The electric power is used in method step 64 for supplying power to the sensor unit 16 and to the communication unit 12. The method additionally has a method step 38 in which the electric power generated by means of the energy harvesting unit 18 is transmitted from the mobile functional apparatus 10 to the external unit 14 at least in part. In method step 38, some of the electric power generated by means of the energy harvesting unit 18 is transmitted from the mobile functional apparatus 10 to the external unit 14. However, it is also conceivable for the electric power to be transmitted from the mobile functional apparatus 10 to the external unit 14 completely in method step 38. In method step 38, the electric power is transmitted from the mobile functional apparatus 10 to the external unit 14 wirelessly. The method additionally has a method step 40 in which electric power is transmitted from the external unit 14 to the mobile functional apparatus 10 at least in part. The external unit 14 may likewise comprise an energy harvesting unit that is provided for generating the electric power. In method step 40, some of the electric power is transmitted from the external unit 14 to the mobile functional apparatus 10. However, it is also conceivable for the electric power to be transmitted from the external unit 14 to the mobile functional apparatus 10 completely in method step 40. In method step 40, the electric power is transmitted from the external unit 14 to the mobile functional apparatus 10 wirelessly.

What is claimed is:

1. A mobile functional apparatus that is arrangeable on a body part of a user, the mobile functional apparatus comprising:
    at least one energy harvesting unit configured to generate electric power by converting at least one form of energy, the at least one energy harvesting device including at least one piezo element configured to generate at least some of the electric power by converting at least one force applied to the mobile functional apparatus;
    an electronic unit connected to the at least one energy harvesting unit and configured to process the electric power generated by the at least one energy harvesting unit;
    at least one sensor unit connected to the at least one energy harvesting unit and configured to capture at least one of a user parameter and an environment parameter, the at least one sensor unit being configured to operate using the electric power; and
    at least one communication unit connected to the at least one energy harvesting unit and configured to transmit at least one of information and a command to at least one external unit, the at least one communication unit being configured to operate using the electric power.

2. The mobile functional apparatus according to claim 1, wherein the at least one piezo element includes a first piezo element arranged near the body part of the user such that it is deformed by forces generated by a pulse of the user, the first piezo element being configured to generate the at least some of electric power in response to deformations thereof.

3. The mobile functional apparatus according to claim 1, further comprising:
    at least one attachment unit having at least one attachment element configured for arrangement on the body part of the user,
    wherein the at least one piezo element includes a second piezo element arranged in at least one attachment unit such that the second piezo element deforms with corresponding deformations of at least one attachment element, the second piezo element being configured to generate at least some of the electric power in response to deformations thereof.

4. The mobile functional apparatus according to claim 1, wherein the at least one energy harvesting unit includes at least one Peltier element configured to generate at least some of the electric power by converting a temperature difference between a skin surface temperature of the body part of the user and an ambient temperature.

5. The mobile functional apparatus according to claim 1, wherein the at least one energy harvesting unit includes at least one radio wave element configured to generate at least some of the electric power by converting a radiation energy from radio waves.

6. The mobile functional apparatus according to claim 1, further comprising:
at least one power transmission unit configured to transmit the electric power generated by the energy harvesting unit to the at least one external unit.

7. The mobile functional apparatus according to claim 1, wherein the at least one communication unit comprises at least one communication element configured to communicate at a frequency of less than 1000 MHz.

8. The mobile functional apparatus according to claim 1, wherein the electronic unit includes (i) a rectifier configured to rectify at least some of the electric power generated by the at least one energy harvesting unit, and (ii) a converter configured to convert a voltage of at least some of the electric power generated by the at least one energy harvesting unit.

9. The mobile functional apparatus according to claim 1, wherein the at least one communication unit is configured to transmit the at least one of the information and the command to at least one external unit depending on the at least one of the user parameter and the environment parameter.

10. A system comprising:
at least one external unit;
at least one mobile functional apparatus including:
at least one energy harvesting unit configured to generate electric power by converting at least one form of energy, the at least one energy harvesting device including at least one piezo element configured to generate at least some of the electric power by converting at least one force applied to the mobile functional apparatus;
an electronic unit connected to the at least one energy harvesting unit and configured to process the electric power generated by the at least one energy harvesting unit;
at least one sensor unit connected to the at least one energy harvesting unit and configured to capture at least one of a user parameter and an environment parameter, the at least one sensor unit being configured to operate using the electric power; and
at least one communication unit connected to the at least one energy harvesting unit and configured to transmit at least one of information and a command to at least one external unit, the at least one communication unit being configured to operate using the electric power; and
at least one power transmission unit configured to transmit electric power between the at least one external unit and the at least one mobile functional apparatus.

11. The system according to claim 10, wherein the power transmission unit is further configured to transmit the electric power generated by the at least one energy harvesting unit from the at least one mobile functional apparatus to the at least one external unit.

12. The system according to claim 10, wherein the power transmission unit is further configured to transmit electric power from the at least one external unit to the at least one mobile functional apparatus.

13. The system according to claim 10, wherein the electronic unit includes (i) a rectifier configured to rectify at least some of the electric power generated by the at least one energy harvesting unit, and (ii) a converter configured to convert a voltage of at least some of the electric power generated by the at least one energy harvesting unit.

14. The system according to claim 10, wherein the at least one communication unit is configured to transmit the at least one of the information and the command to at least one external unit depending on the at least one of the user parameter and the environment parameter.

* * * * *